United States Patent
Yoo et al.

(10) Patent No.: US 7,253,058 B2
(45) Date of Patent: Aug. 7, 2007

(54) METHOD OF MANUFACTURING NOR-TYPE MASK ROM DEVICE AND SEMICONDUCTOR DEVICE INCLUDING THE SAME

(75) Inventors: Hyun-Khe Yoo, Suwon-si (KR); Weon-ho Park, Suwon-si (KR); Byoung-ho Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 204 days.

(21) Appl. No.: 10/899,136

(22) Filed: Jul. 27, 2004

(65) Prior Publication Data
US 2005/0032288 A1    Feb. 10, 2005

(30) Foreign Application Priority Data
Aug. 6, 2003    (KR) .................. 10-2003-0054346

(51) Int. Cl.
*H01L 21/8234* (2006.01)
(52) U.S. Cl. ...................... 438/275; 438/278
(58) Field of Classification Search ............ 438/257, 438/258, 275, 276, 278, 289
See application file for complete search history.

(56) References Cited
U.S. PATENT DOCUMENTS 5,091,329 A    2/1992   Bekkering et al.
5,793,086 A *  8/1998   Ghio et al. .................. 257/390
6,194,274 B1 * 2/2001   Che ........................... 438/278
6,197,639 B1 * 3/2001   Lee et al. .................... 438/258
6,218,247 B1 * 4/2001   Yeuan ........................ 438/275
6,323,091 B1 * 11/2001  Lee et al. .................... 438/275

FOREIGN PATENT DOCUMENTS

| JP | 7-66302     | 3/1995 |
| JP | 10-041411   | 2/1998 |
| KR | 1998-53138  | 9/1998 |

* cited by examiner

*Primary Examiner*—Tuan H. Nguyen
(74) *Attorney, Agent, or Firm*—Lee & Morse, P.C.

(57) ABSTRACT

A method of manufacturing a NOR-type mask ROM device includes forming a first gate electrode for an OFF cell and a second gate electrode for an ON cell on a semiconductor substrate of a first conductivity type. To code the mask ROM device, a plurality of source/drain regions is formed by implanting impurities of a second conductivity type, opposite the first conductivity type, into the semiconductor substrate adjacent only to one side of the first gate electrode and adjacent to both sides of the second gate electrode. To prevent misalignment of a bit line contact hole with a contact region, additional impurities are implanted only into a bit line contact region of the mask ROM device region. When a semiconductor device formed on the same substrate as the mask ROM device includes a double diffused region, additional implantation for both may be realized simultaneously.

14 Claims, 4 Drawing Sheets

METHOD OF MANUFACTURING NOR-TYPE MASK ROM DEVICE AND SEMICONDUCTOR DEVICE INCLUDING THE SAME

BACKGROUND OF THE INVENTION

1. Field of the Invention

The present invention relates to a method of manufacturing a read only memory (ROM) device of a semiconductor device. More particularly, the present invention relates to a method of manufacturing a NOR-type mask ROM device and a semiconductor device including the same.

2. Description of the Related Art

A ROM is a nonvolatile memory device, in which stored data is not written over during normal operation. The ROM can be classified into a mask ROM, a programmable ROM (PROM), a one time PROM (OTPROM), an erasable PROM (EPROM), and an electrically erasable PROM (EEPROM).

Data is stored in the mask ROM when it is manufactured by coding using a mask on which data intended to be stored is written. Data that has been stored in the mask ROM cannot be written over, but can be read.

Data can be coded in the mask ROM by implanting impurities into a predetermined transistor such that the predetermined transistor has a different conductivity from other transistors of the mask ROM.

Typically, when verification of a user data code is completed in a product-developing step of semiconductor devices, chip customers order a large quantity of products for each code from chip manufacturers. In order to meet the customers' demand rapidly, chip manufacturers manufacture a master version of each product beforehand and have the master version on stand-by in a bank step, i.e., a step prior to a coding step.

Here, the competitiveness of the chip manufacturers depends on turn-around time (TAT), which is the time needed to manufacture a wafer and provide a chip to a customer after acquiring a user code.

A cell of a mask ROM can be categorized into a NOR or NAND type. A NAND-type mask ROM device requires coding before a gate electrode of a transistor is formed, thus resulting in a large TAT. That is, in a NAND-type mask ROM device, before forming a gate electrode of a transistor, a photolithography process is performed to implant impurities that have the same conductivity type as a source/drain region of the transistor into a coding region of the mask ROM. Thus, a depletion-type transistor for an ON cell is completed. An OFF cell includes a transistor that has a threshold voltage $V_{th}$, which varies according to a dopant concentration of a substrate, the thickness of a gate oxide layer, and the concentration of subsequently implanted impurities in the source/drain region. Therefore, since coding of the NAND-type mask ROM is subsequently followed by formation of a gate electrode, the TAT increases.

However, in a NOR-type mask ROM, after forming a gate electrode and implanting impurities in a source/drain region of a transistor, a photolithography process is performed to implant impurities that have an opposite conductivity type to the conductivity type of the source/drain region into a coding region of the mask ROM. Thus, an OFF cell is formed by increasing the threshold voltage $V_{th}$ of the coded transistor. An ON cell is a cell that has a normal threshold voltage $V_{th}$. As described above, the NOR-type mask ROM entails coding after forming the gate electrode of the transistor. Since a master wafer is on stand-by before a back end metallization, TAT can be reduced. However, the manufacturing of the NOR-type mask ROM is costly because coding after gate electrode formation requires additional reticles.

SUMMARY OF THE INVENTION

The present invention is therefore directed to a method of manufacturing a NOR-type mask ROM device, and a semiconductor device having a NOR-type mask ROM device, which substantially overcome one or more of the problems due to the limitations and disadvantages of the related art.

It is therefore a feature of an embodiment of the present invention to eliminate the need for an additional reticle for coding. It is another feature of the present invention to reduce turn-around time (TAT). It is yet another feature of the present invention to eliminate the need for an additional reticle for coding when manufacturing a semiconductor device including the NOR-type mask ROM device. It is still another feature of the present invention to reduce turn-around time (TAT) when manufacturing a semiconductor device including the NOR-type mask ROM device.

At least one of the above and other features and advantages of an embodiment of the present invention may be realized by providing a method of manufacturing a NOR-type mask ROM including forming a first gate electrode for an OFF cell and a second gate electrode for an ON cell on a semiconductor substrate of a first conductivity type. The mask ROM is coded by forming a plurality of source/drain regions by performing an ion implantation process such that impurities of a second conductivity type, opposite the first conductivity type, are implanted into a portion of the semiconductor substrate adjacent only to a first side of the first gate electrode and into portions of the semiconductor substrate respectively adjacent to both sides of the second gate electrode.

The first conductivity type may be a p-type conductivity, and the second conductivity type may be an $n^+$-type conductivity. The coding of the mask ROM may include forming a photoresist pattern covering a second side of the first gate electrode and a predetermined width of the semiconductor substrate adjacent to the second side of the first gate electrode and implanting impurities of the second conductivity type into the semiconductor substrate, the first gate electrode, the second gate electrode, and the photoresist pattern serving as an ion implantation mask. A channel cut off region in the semiconductor substrate may have a width equal to the predetermined width defined by the photoresist pattern.

The method may include forming an interlayer dielectric that covers the first gate electrode, the second gate electrode, and the semiconductor substrate, forming a bit line contact hole that exposes one of the source/drain regions through the interlayer dielectric, and additionally implanting impurities of the second conductivity type into the source/drain region exposed by the bit line contact hole. The method may include forming a source line contact hole that exposes another of the source/drain regions through the interlayer dielectric. The bit line contact hole and the source line contact hole may be formed at the same time. The method may include forming a bit line that is connected to the source/drain region exposed by the bit line contact hole and forming a source line that is connected to the source/drain region exposed by the source line contact hole.

The method may include forming insulating spacers on both sidewalls of each of the first gate electrode and the second gate electrode. The coding of the mask ROM is then performed after forming the insulating spacers.

At least one of the above and other advantages and features of an embodiment of the present invention may be realized by providing a method of manufacturing a semiconductor device including forming a gate insulating layer on a semiconductor substrate of a first conductivity type, the semiconductor substrate including a mask read only memory (ROM) device region and a high voltage device region, forming a plurality of gate electrodes in each of the mask ROM device region and the high voltage device region on the gate insulating layer, forming a mask islanded double diffused drain (MIDDD) type lightly doped region in the high voltage device region by implanting impurities of a second conductivity type, opposite the first conductivity type, only into the high voltage device region. The mask ROM is coded by forming a plurality of source/drain regions by selectively implanting impurities of the second conductivity type only into the mask ROM device region to define an ON cell and an OFF cell in the mask ROM device region. An MIDDD-type heavily doped region in the high voltage device region is formed by additionally implanting impurities of the second conductivity type into the MIDDD-type lightly doped region of the high voltage device region. Additional impurities of the second conductivity type are selectively implanted only into a source/drain region having a bit line contact in the mask ROM device region concurrently with the additional implanting of impurities of the second conductivity type for forming the MIDDD-type heavily doped region in the high voltage device region.

The forming of the gate insulating layer includes forming a gate insulating layer with a first thickness in the mask ROM device region and forming a gate insulating layer with a second thickness in the high voltage device region, the second thickness being greater than the first thickness. An electrically erasable and programmable ROM (EEPROM) is formed in the high voltage device region. The first conductivity type may be a p-type conductivity, and the forming of the MIDDD-type lightly doped region may include implanting $n^-$-type impurities into the high voltage device region. The implanting of additional implanting of impurities of the second conductivity type may include implanting $n^+$-type impurities. The method may further include forming insulating spacers on both sidewalls of each of the plurality of gate electrodes, wherein the coding of the mask ROM is performed after forming the insulating spacers.

The method of manufacturing may include forming a plurality of gate electrodes including a first gate electrode for an OFF cell and a second gate electrode for an ON cell in the mask ROM device region, wherein the coding of the mask ROM includes implanting impurities of the second conductivity type into a portion of the semiconductor substrate adjacent only to a first side of the first gate electrode and into portions of the semiconductor substrate respectively adjacent to both sides of the second gate electrode. The first conductivity type may be a p-type conductivity and the second conductivity type may be an $n^+$-type conductivity. The coding of the mask ROM may further include forming a photoresist pattern covering a second side of the first gate electrode and a predetermined width of the semiconductor substrate adjacent to the second side of the first gate electrode, and implanting impurities of the second conductivity type into the semiconductor substrate, the first gate electrode, the second gate electrode, and the photoresist pattern serving as an ion implantation mask. A channel cut off region in the semiconductor substrate may have a width equal to the predetermined width defined by the photoresist pattern. The method may further include forming an interlayer dielectric that covers the first gate electrode, the second gate electrode, and the semiconductor substrate, and forming a bit line contact hole that exposes one of the source/drain regions in the mask ROM device region through the interlayer dielectric. The selective additional implanting of the impurities of the second conductivity type into the mask ROM device region may include implanting impurities of the second conductivity type into the source/drain region exposed by the bit line contact hole. The method may further include forming a contact hole that exposes the MIDDD-type lightly doped region through the interlayer dielectric in the high voltage device region concurrently with the forming of the bit line contact hole in the mask ROM device region. The forming of the MIDDD-type heavily doped region in the high voltage device region may further include additional implanting impurities of the second conductivity type into the MIDDD-type lightly doped region exposed by the contact hole.

To manufacture a NOR-type mask ROM device by an after gate process (AGP), a mask ROM is coded by an ion implantation process in which an NMOS source/drain region is formed. Concurrently with a plug ion implantation process in which a cell depletion enhancement N-channel (DEN) of a high voltage (HV) device, which is formed on the same wafer as a mask ROM device, is formed, impurities are additionally implanted into a bit line contact region of a mask ROM device region, in order to prevent the electrical characteristics of the mask ROM device from deteriorating due to misalignment of a bit line contact hole with a contact region. As a result, a NOR-type mask ROM can be manufactured by the AGP without an additional reticle, thus shortening the TAT.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
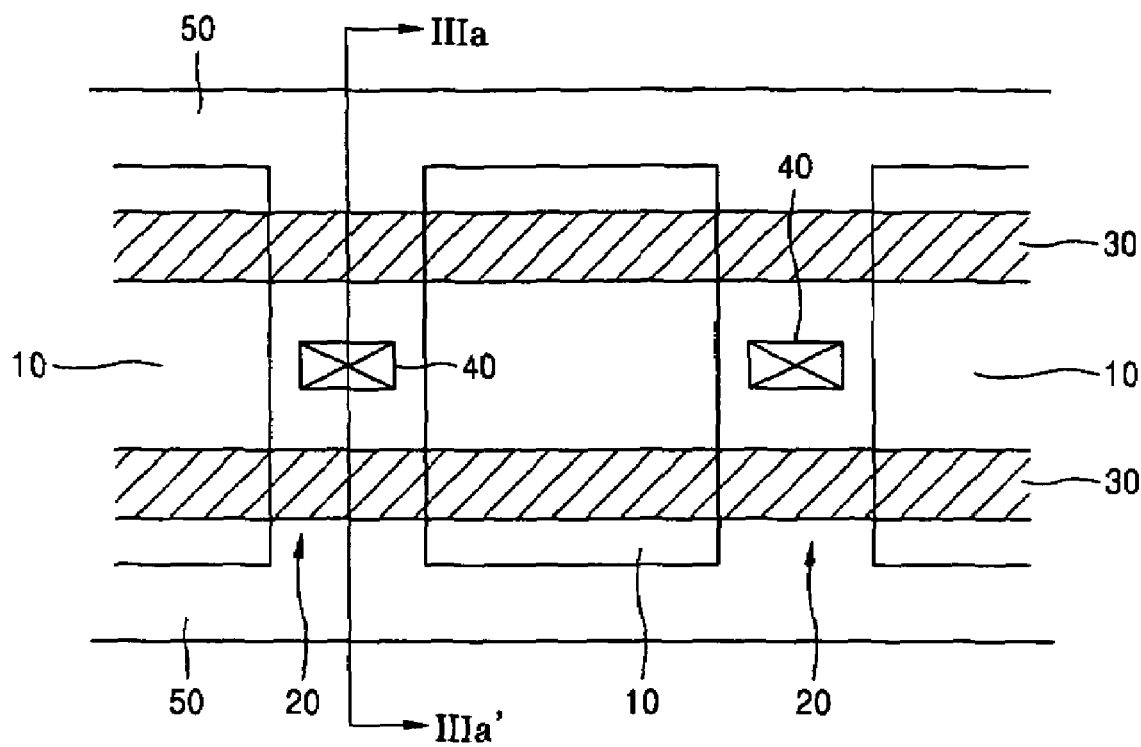
FIG. 1 illustrates a layout of a NOR-type mask ROM device manufactured using a method according to an embodiment of the present invention.

Korean Patent Application No. 2003-54346, filed on Aug. 6, 2003, in the Korean Intellectual Property Office, entitled: "Method for Manufacturing NOR type Mask ROM Device and Semiconductor Device Including the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a 4-bit cell formed in a cell array region of a NOR-type mask ROM device according to the present invention. The 4-bit cell includes an active region 20 defined by a plurality of isolation regions 10 in the mask ROM device. A plurality of word lines 30, which constitute a gate electrode, extends in a predetermined direction on the active region 20. A bit line contact 40 is formed between two adjacent word lines 30. A source line 50 is formed in the active region 20 opposite the bit line contact 40 across one word line 30.

Figure 2:
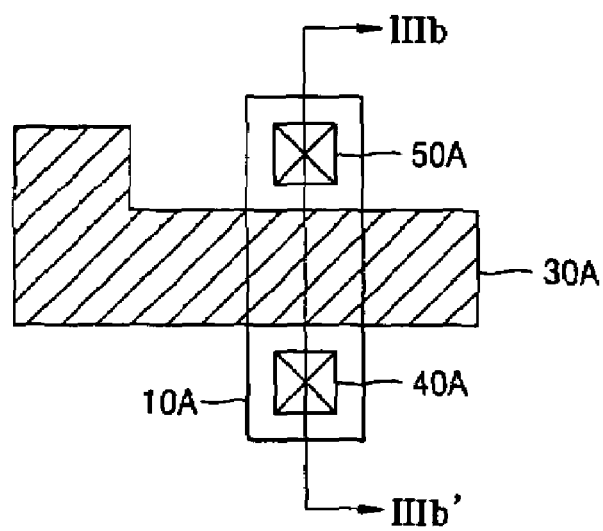
FIG. 2 illustrates a layout of a high voltage (HV) device that is manufactured at the same time on the same wafer as the NOR-type mask ROM device according to an embodiment of the present invention.

FIG. 2 illustrates the layout of a high voltage (HV) device (e.g., an EEPROM device) that is manufactured at the same time on the same wafer as the NOR-type mask ROM device according to the present invention.

FIG. 2 illustrates a 1-bit cell formed in a cell array region of the HV device.

Referring to FIG. 2, the 1-bit cell includes a gate electrode 30A formed on an island-shaped active region 10A, and source/drain regions 40A and 50A are formed in the active region 10A on opposite sides of the gate electrode 30A.

FIGS. 3A through 3G are cross-sectional views illustrating stages in a method of manufacturing a semiconductor device according to an embodiment of the present invention. FIGS. 3A through 3G each illustrate cross-sections of both the cell array region of the NOR-type mask ROM device taken along line IIIa-IIIa' of FIG. 1 (hereinafter, referred to as a "mask ROM device region" and denoted by "MASK ROM" in the drawings), and the cell array region of the HV device (e.g., an EEPROM device), which is taken along line IIIb-IIIb' of FIG. 2 (hereinafter, referred to as an "HV device region" and denoted by "HV CELL" in the drawings).

Figure 3A:
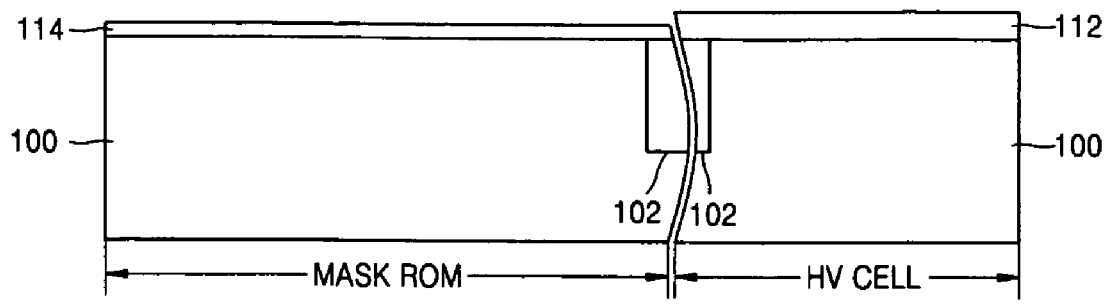
FIGS. 3A through 3G are cross-sectional views illustrating stages in a method of manufacturing a semiconductor device according to the present invention.

Referring to FIG. 3A, an isolation region 102 is formed in a p-type semiconductor substrate 100 and defines an active region of a mask ROM device region and an active region of an HV device region. The semiconductor substrate 100 may be formed of a p-type silicon substrate or a p-type well formed in a silicon substrate. The isolation region 102 may be formed by local oxidation of silicon (LOCOS) or shallow trench isolation (STI). The isolation region illustrated in the drawing is formed by a STI technique.

To form a gate insulating layer of the HV device, a first oxide layer is formed, e.g., using thermal oxidation, on the entire surface of the semiconductor substrate 100. Then the first oxide layer formed in the mask ROM device region is removed using a photoresist pattern (not shown) covering the HV device region as an etch mask. Next, to form a gate insulating layer of the mask ROM device, a second oxide layer is formed, e.g., using thermal oxidation, on the semiconductor substrate 100. Thus, a thick double-oxide layer 112 that includes the first oxide layer and the second oxide layer is formed in the HV device region. On the other hand, in the mask ROM device region, since only the second oxide layer is formed on the semiconductor substrate 100 in the mask ROM device region, a thin oxide layer 114 adequate for a low voltage (LV) device is obtained.

Figure 3B:
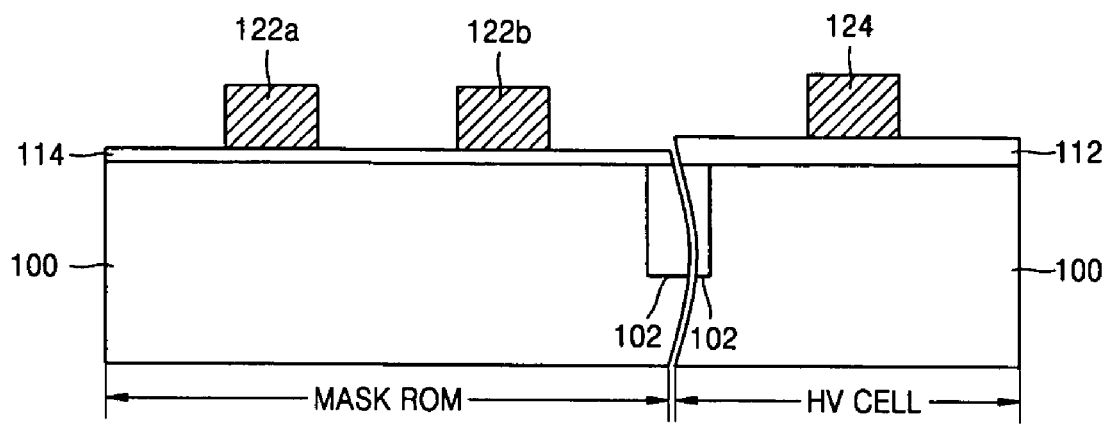

Referring to FIG. 3B, a doped polysilicon layer is formed on the entire surfaces of the thick double-oxide layer 112 and the thin oxide layer 114 and patterned by a photolithography process. Thus, a first gate electrode 122a and a second gate electrode 122b are formed on the thin oxide layer 114 in the mask ROM device region, and, at the same time, a gate electrode 124 is formed on the thick oxide layer 112 in the HV region.

Figure 3C:
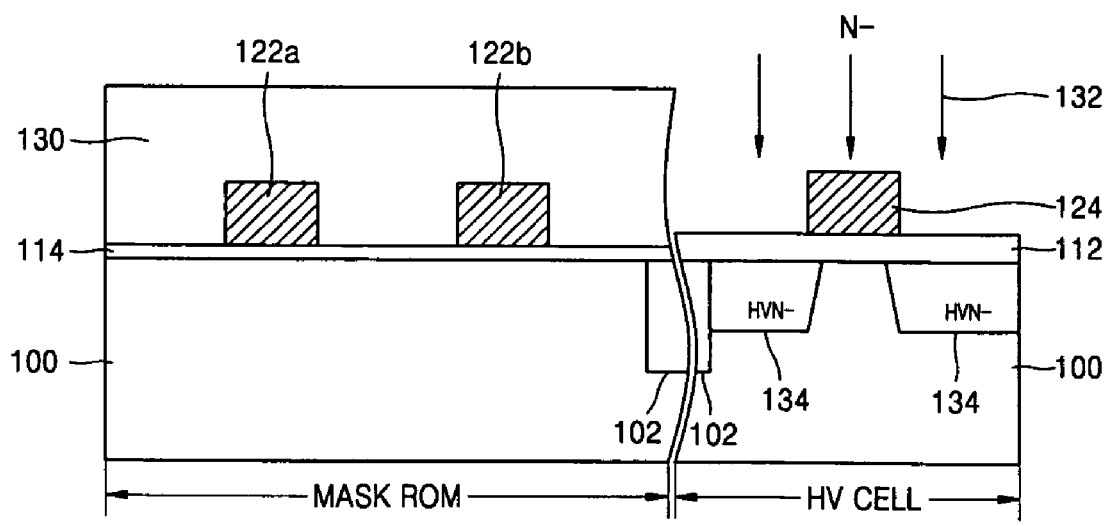

Referring to FIG. 3C, to form an HV transistor with a mask islanded double diffused drain (MIDDD) structure in the HV device region, a photoresist pattern 130 is formed on the mask ROM device region, and n$^-$-type impurities 132 are implanted into the HV device region. Thus, HV N$^-$-type doped regions 134 are formed in the semiconductor substrate 100 on both sides of the gate electrode 124. The HV N$^-$-type doped regions 134 constitute MIDDD-type lightly doped regions. While the n$^-$-type impurities 132 are being implanted into the HV device region, a PMOS forming region is also covered by the photoresist pattern 130. Although only the forming of an NMOS device in the HV device region is illustrated in FIG. 3C, the same process can be applied to forming a PMOS device in the HV device region. That is, although not shown in the drawings, while the entire mask ROM device region and an NMOS forming region of the HV device region are covered by a photoresist pattern (not shown), an HV p$^-$-type doped region is formed in a PMOS forming region of the HV device region by implanting p$^-$-type impurities into the HV device region.

After the photoresist pattern 130 is removed, an ion implantation process for a lightly doped drain (LDD) is selectively performed on a device forming region of a wafer, which requires an LDD structure, i.e., a logic region (not shown). Since a source/drain region overlaps a gate electrode by a sufficient overlap margin in a ROM transistor, even if the LDD ion implantation process is omitted, the electrical characteristics of the mask ROM device, associated with a threshold voltage $V_{th}$ and a source/drain current $I_{ds}$, are not adversely affected.

Figure 3D:
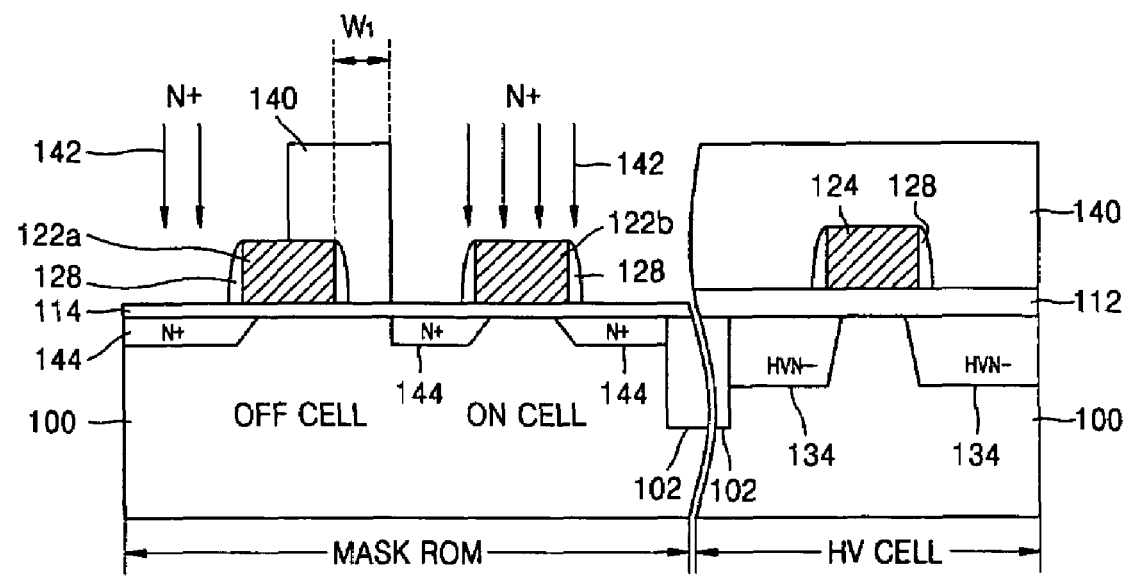

Referring to FIG. 3D, insulating spacers 128 are formed on sidewalls of the first and second gate electrodes 122a and 122b of the mask ROM device region and the gate electrode 124 of the HV device region. Thereafter, a photoresist pattern 140 is formed on the entire HV device region and a portion of the mask ROM device region. Then n$^+$-type impurities 142 are implanted into the mask ROM device region, with the photoresist pattern 140, and the first and second gate electrodes 122a and 122b, serving as an ion implantation mask. When the n$^+$-type impurities 142 are implanted into the mask ROM device region, one sidewall of the first gate electrode 120a and a portion of the semiconductor substrate 100 adjacent to the one sidewall of the first gate electrode 120a are covered by the photoresist pattern 140, such that the n$^+$-type impurities 142 are only implanted into the portion of the semiconductor substrate 100 adjacent to the other sidewall of the first gate electrode 120a in an OFF cell forming region, denoted by "OFF CELL" in FIG. 3D. In an ON cell forming region, denoted by "ON CELL" in FIG. 3D, the n$^+$-type impurities 142 are implanted into the semiconductor substrate 100 on both sides of the second gate electrode 122b. As a result, an n$^+$-type doped region 144 is formed on one side of the first gate electrode 122a in the OFF cell forming region of the semiconductor substrate 100, while n$^+$-type doped regions 144 are formed on both sides of the second gate electrode 122b in the ON cell forming region of the semiconductor substrate 100. The n$^+$-type doped regions 144 constitute n+-type source/drain junction regions. The n$^+$-type doped region 144 that is disposed between the first gate electrode 122a and the second gate electrode 122b constitutes a bit line contact and is spaced a sufficient distance from the first gate electrode 122a. Thus, a channel cut off region is formed between the n$^+$-type doped region 144 that is between the first and second gate electrodes 122a and 122b, and the first gate electrode 122a.

To obtain this structure, a portion of the semiconductor substrate 100 that is covered by the photoresist pattern 140 adjacent to the one sidewall of the first gate electrode 122a has a sufficient width such that a channel cannot be formed below the first gate electrode 122a under any circumstances. Thus, a channel cut off region in the semiconductor substrate 100 having a width $W_1$ is defined by the photoresist pattern 140. Accordingly, even if a predetermined voltage is applied to the first gate electrode 122a, the semiconductor substrate 100 disposed directly under the first gate electrode 122a always remains off. On the other hand, a normal channel is formed below the second gate electrode 122b.

Figure 3E:
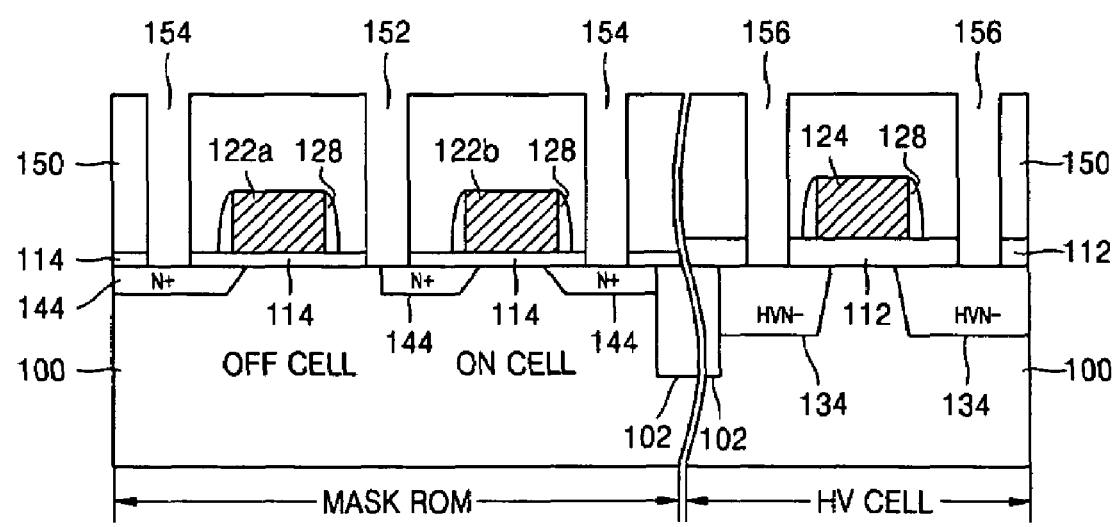

Referring to FIG. 3E, after the photoresist pattern 140 is removed, a planarized interlayer dielectric (ILD) 150 is formed on the entire surface of the resultant structure. Then the ILD 150, the thick oxide layer 112, and the thin oxide layer 114 are sequentially patterned by a photolithography process. Thus, a bit line contact hole 152 and source line contact holes 154 are formed in the mask ROM device region such that the surfaces of the n$^+$-type doped regions 144 are exposed, while contact holes 156 are formed in the HV device region such that the HV N$^-$-type doped regions 134 are exposed. Here, as the integration density of semiconductor devices increases, the bit line contact hole 152 may be misaligned with the n$^+$-type doped region 144 as a drain due to a lack of contact margin.

Figure 3F:
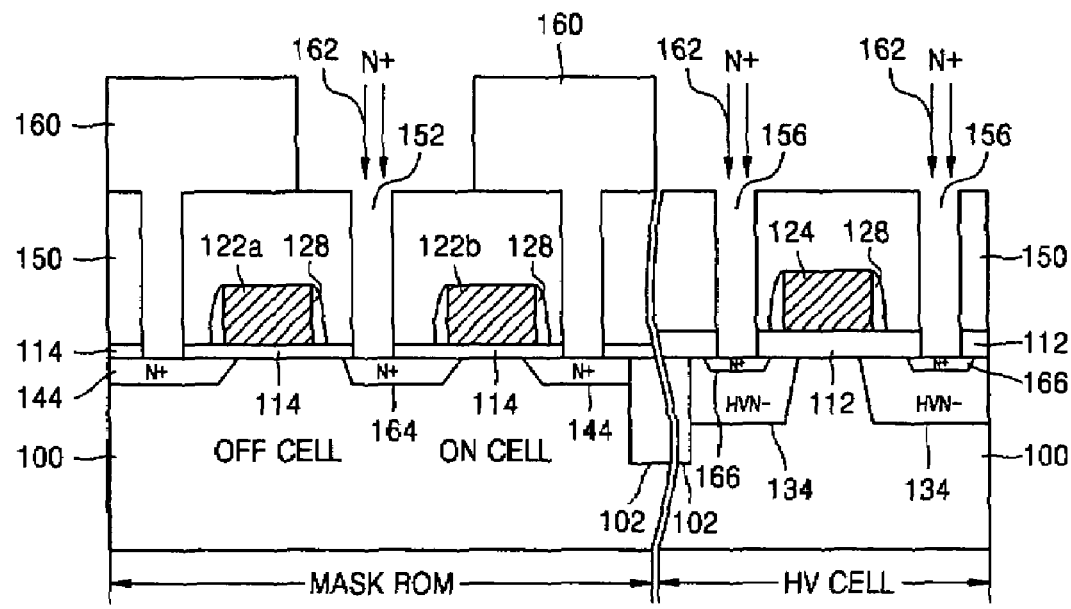

Referring to FIG. 3F, in order to prevent the electrical characteristics of the mask ROM device from deteriorating due to misalignment of the bit line contact hole 152 with the n$^+$-type doped region 144, an extending n$^+$-type doped region 164 may be formed by additionally implanting n$^+$-type impurities 162 into the surface of the semiconductor substrate 100 exposed through the bit line contact hole 152. The n$^+$-type impurities 162 may be implanted using a conventional n$^+$-type ion implantation process that is used to form a cell depletion enhancement N-channel (DEN) in an HV device region.

More specifically, a photoresist pattern 160 is formed only in the mask ROM device region on the resultant structure where the ILD 150 is formed, which defines the bit line contact hole 152, the source line contact hole 154, and the contact hole 156. The photoresist pattern 160 exposes only the bit line contact hole 152 and a portion adjacent to the bit line contact hole 152 in the mask ROM device region. Since the HV device region is not covered by the photoresist pattern 160, the HV n$^-$-type doped regions 134 are exposed through the contact holes 156. Using plug ion implantation, the n$^+$-type impurities 162 are implanted into the surface of the semiconductor substrate 100 exposed through the bit line contact hole 152 and the contact hole 156, with the photoresist pattern 160 and the ILD 150 serving as an ion implantation mask. This ion implantation process is required to improve the breakdown voltage of an HV transistor by forming an MIDDD structure in the HV device region. Thus, n$^+$-type doped regions 166 are formed by implanting the n$^+$-type impurities 162 into NMOS contact portions of the HV device region. At the same time, the extending n$^+$-type doped region 164 is formed by additionally implanting the n$^+$-type impurities 162 into an NMOS contact portion, i.e., a bit line contact region (as denoted by reference numeral 40 in FIG. 1), of the mask ROM device region. The n$^+$-type doped regions 166 constitute MIDDD-type heavily doped regions in the HV device region. Since the extending n$^+$-type doped region 164 is formed at the same time as the n$^+$-type doped regions 166 of the HV device region, it can be formed without an additional reticle. To form the extended n$^+$-type doped region 164 and the n$^+$-type doped regions 166, the n$^+$-type impurities 162 can be implanted at a dose of, e.g., 1.0E13/cm$^2$ to 9.0E15/cm$^2$.

In the mask ROM device region, the formation of the extending n$^+$-type doped region 164 prevents a short between a bulk region of the semiconductor substrate 100 and a bit line, reduces a junction leakage current, and results in a high breakdown voltage $V_{pp}$. In the HV device region, the formation of the MIDDD structure including the HV n$^-$-type doped regions 134 and the n$^+$-type doped regions 166 increases the breakdown voltage of the HV transistor.

Figure 3G:
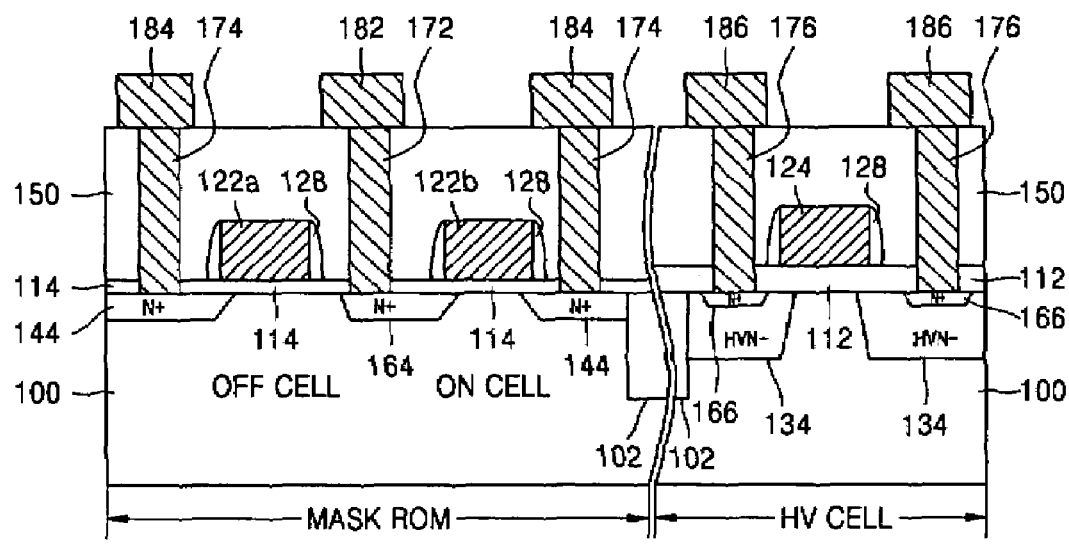

Referring to FIG. 3G, the photoresist pattern 160 is removed, and a typical interconnection forming process is performed on the resultant structure. Thus, in the mask ROM device region, a drain contact plug 172 and source contact plugs 174, along with a bit line 182 and source lines 184, are formed. The drain contact plug 172 and the source contact plugs 174 are respectively connected to the bit line 182 and the source lines 184. Also, contact plugs 176 and interconnection layers 186 are formed in the HV device region. The contact plugs 176 are respectively connected to the interconnection layers 186. As a result, a final semiconductor device is completed.

In the method of manufacturing the mask ROM device of the present invention, to manufacture a NOR-type ROM device by an after gate process (AGP), the mask ROM is coded by forming an NMOS source/drain region using an ion implantation process. Here, n$^+$-type impurities are only implanted into a semiconductor substrate adjacent to one sidewall of a gate electrode in an OFF cell forming region, such that a channel cannot be formed below the gate electrode under any circumstances. Also, an n$^+$-type plug ion implantation process for forming a cell DEN may be performed in a mask ROM device region to prevent the electrical characteristics of the mask ROM device from deteriorating due to misalignment of a bit line contact hole with an NMOS contact region. The n$^+$-type plug ion implantation for forming the cell DEN is performed to increase the breakdown voltage of an HV transistor during forming of an HV device (e.g., an EEPROM device) on the same substrate as the mask ROM device. In other words, concurrently with the n$^+$-type plug ion implantation for forming a cell DEN on the HV device region, n$^+$-type impurities are additionally implanted into an NMOS bit line contact region of the mask ROM device region. As a result, an extending n$^+$-type doped region is formed in the mask ROM device region without an additional reticle. Thus, a short is prevented between a bulk region of a semiconductor substrate and a bit line. Also, junction currents can be reduced and a high breakdown voltage $V_{pp}$ can be obtained. Therefore, using the method of the present invention, a NOR-type mask ROM device according to the present invention, can be manufactured without an additional reticle, while greatly reducing the TAT.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a NOR-type mask read only memory (ROM), comprising:
   forming a first gate electrode for an OFF cell and a second gate electrode for an ON cell on a semiconductor substrate of a first conductivity type; and
   coding a mask ROM by forming a plurality of source/drain regions by performing an ion implantation process such that impurities of a second conductivity type, opposite the first conductivity type, are implanted into a portion of the semiconductor substrate adjacent only to a first side of the first gate electrode for the OFF cell and into portions of the semiconductor substrate respectively adjacent to both sides of the second gate electrode for the ON cell;
   wherein the semiconductor substrate disposed directly under the first gate electrode for the OFF CELL always remains off.

2. The method as claimed in claim 1, wherein the lint conductivity type is a p-type conductivity, and the second conductivity type is an n⁺-type conductivity.

3. The method as claimed in claim 1, wherein the coding of the mask ROM further comprises:
   forming a photoresist pattern covering a second side of the first gate electrode and a predetermined width of the semiconductor substrate adjacent to the second side of the first gate electrode; and
   implanting impurities of the second conductivity type into the semiconductor substrate, the first gate electrode, the second gate electrode, and the photoresist pattern serving as an ion implantation mask.

4. The method as claimed in claim 3, wherein a channel cut off region in the semiconductor substrate has a width equal to the predetermined width defined by the photoresist pattern.

5. The method as claimed in claim 1, further comprising:
   forming an interlayer dielectric that covers the first gate electrode, the second gate electrode, and the semiconductor substrate;
   forming a bit line contact hole that exposes one of the source/drain regions through the interlayer dielectric; and
   additionally implanting impurities of the second conductivity type into the source/drain region exposed by the bit line contact hole.

6. The method as claimed in claim 5, further comprising forming a source line contact hole that exposes another of the source/drain regions through the interlayer dielectric,
   wherein the bit line contact hole and the source line contact hole are formed at the same time.

7. The method as claimed in claim 6, further comprising:
   forming a bit line that is connected to the source/drain region exposed by the bit line contact hole; and
   forming a source line that is connected to the source/drain region exposed by the source line contact hole.

8. The method as claimed in claim 1, further comprising forming insulating spacers on both sidewalls of each of the first gate electrode and the second gate electrode,
   wherein the coding of the mask ROM is performed after forming The insulating spacers.

9. A method of manufacturing a semiconductor device, the method comprising:
   forming a gate insulating layer on a semiconductor substrate of a first conductivity type, the semiconductor substrate including a mask read only memory (IROM) device region and a high voltage device region;
   forming a plurality of gate electrodes in each of the mask ROM device region and the high voltage device region on the gate insulating layer;
   a first gate electrode for an OFF cell and a second gate electrode for an ON cell in the mask ROM device region,
   forming a mask islanded double diffused drain (MIDDD) type lightly doped region in the high voltage device region by implanting impurities of a second conductivity type, opposite the first conductivity type, only into the high voltage device region;
   coding a mask ROM by forming a plurality of source/drain regions by selectively implanting impurities of the second conductivity type only into the mask ROM device region to define the ON cell and the OFF cell in the mask ROM device region, wherein the coding of the mask ROM includes implanting impurities of the second conductivity type into a portion of the semiconductor substrate adjacent only to a first side of the first gate electrode for the OFF cell and into portions of the semiconductor substrate respectively adjacent to both sides of the second gate electrode for the ON cell, wherein the semiconductor substrate disposed directly under the first gate electrode for the OFF CELL always remains off;
   forming an MIDDD-type heavily doped region in the high voltage device region by additionally implanting impurities of the second conductivity type into the MIDDD-type lightly doped region of the high voltage device region; and
   selectively additionally implanting impurities of the second conductivity type only into a source/drain region having a bit line contact in the mask ROM device region concurrently with the additional implanting of impurities of the second conductivity type for forming the MIDDD-type heavily doped region in the high voltage device region.

10. The method as claimed in claim 9, wherein the first conductivity type is a p-type conductivity and the second conductivity type is an n⁺t-type conductivity.

11. The method as claimed, in claim 9, wherein the coding of the mask ROM further comprises:
    forming a photoresist pattern covering a second side of the first gate electrode and a predetermined width of the semiconductor substrate adjacent to the second side of the first gate electrode; and
    implanting impurities of the second conductivity type into the semiconductor substrate, the first gate electrode, the second gate electrode, and the photoresist pattern serving as an ion implantation mask.

12. The method as claimed in claim 11, wherein a channel cut off region in the semiconductor substrate has a width equal to the predetermined width defined by the photoresist pattern.

13. The method as claimed in claim 11, further comprising:
    forming an interlayer dielectric that covers the first gate electrode, the second gate electrode, and the semiconductor substrate; and
    forming a bit line contact hole that exposes one of the source/drain regions in the mask ROM device region through the interlayer dielectric,
    wherein the selective additional implanting of the impurities of the second conductivity type into the mask ROM device region includes implanting impurities of the second conductivity type into the source/drain region exposed by the bit line contact hole.

14. The method as claimed in claim 13, wherein a contact hole that exposes the MIDDD-type lightly doped region through the interlayer dielectric is formed in the high voltage device region concurrently with the forming of the bit line contact hole in the mask ROM device region.

wherein the fanning of the MIDDD-type heavily doped region in, the high voltage device region further includes additional implanting impurities of the second conductivity type into the MIDDD-type lightly doped region exposed by the contact hole.

* * * * *